United States Patent
Chen et al.

[11] Patent Number: 6,040,248
[45] Date of Patent: Mar. 21, 2000

[54] CHEMISTRY FOR ETCHING ORGANIC LOW-K MATERIALS

[75] Inventors: Chao-Cheng Chen, Matou; Ming-Hsin Huang, Hsin-chu; Hun-Jan Tao, Hsin-chu; Chia-Shiung Tsai, Hsin-chu, all of Taiwan

[73] Assignee: Taiwan Semiconductor Manufacturing Company, Hsin-Chu, Taiwan

[21] Appl. No.: 09/104,032

[22] Filed: Jun. 24, 1998

[51] Int. Cl.[7] .................. H01L 21/302; H01L 21/461; C23F 1/02

[52] U.S. Cl. ................. 438/725; 216/13; 216/51; 216/67

[58] Field of Search .................. 216/13, 58, 67, 216/18, 51; 438/623, 637, 725, 743

[56] References Cited

U.S. PATENT DOCUMENTS

| | | | |
|---|---|---|---|
| 4,470,871 | 9/1984 | White et al. | 156/628 |
| 5,007,983 | 4/1991 | Lerner et al. | 156/643 |
| 5,204,416 | 4/1993 | Mercer et al. | 525/390 |
| 5,482,894 | 1/1996 | Havemann | 437/195 |
| 5,486,493 | 1/1996 | Jeng | 437/195 |
| 5,591,677 | 1/1997 | Jeng | 437/195 |
| 5,770,095 | 6/1998 | Sasaki et al. | 216/38 |

OTHER PUBLICATIONS

Noda et al. "A 2.9 $\mu m^2$ Embedded SRAM Cell with Co–Salicide Direct Strap Technology for 0.18 $\mu m$ High Performance CMOS Logic", IEDM '97, pp. 847–850.

*Primary Examiner*—Richard Bueker
*Assistant Examiner*—Alva C Powell
*Attorney, Agent, or Firm*—George O. Saile; Stephen B. Ackerman

[57] ABSTRACT

A process for plasma etching of contact and via openings in low-k organic polymer dielectric layers is described which overcomes problems of sidewall bowing and hardmask pattern deterioration by etching the organic layer in a high density plasma etcher with a chlorine/inert gas plasma. By adding chlorine to the oxygen/inert gas plasma, the development of an angular aspect or faceting of the hardmask pattern edges by ion bombardment is abated. Essentially vertical sidewalls are obtained in the openings etched in the organic polymer layer while hardmask pattern integrity is maintained. The addition of a passivating agent such as nitrogen, $BCl_3$, or $CHF_3$ to the etchant gas mixture further improves the sidewall profile by reducing bowing through protective polymer formation.

18 Claims, 4 Drawing Sheets

CHEMISTRY FOR ETCHING ORGANIC LOW-K MATERIALS

BACKGROUND OF THE INVENTION (1) Field of the Invention

The invention relates to processes for the manufacture of semiconductor devices and more Particularly to processes related to etching of organic, low dielectric constant insulative layers on semiconductor wafers.

(2) Description of Previous Art

Integrated circuits(ICs) are manufactured by first forming discrete semiconductor devices within the surface of silicon wafers. A multi-level metallurgical interconnection network is then formed over the devices contacting their active elements and wiring them together to create the desired circuits. The wiring layers are formed by first depositing an insulating layer over the discrete devices, patterning and etching contact openings into this layer, and then depositing conductive material into these openings. A conductive layer is then applied over the insulating layer which is patterned and etched to form wiring interconnections between the device contacts thereby creating a first level of basic circuitry. These basic circuits are then further interconnected by utilizing additional wiring levels laid out over a additional insulating layers with via pass throughs.

The performance or speed of the integrated circuits is determined in large part by the conductance and capacitance of the metal wiring network. For many years aluminum wring and silicon oxide inter level dielectric layers have been the norm. As device densities increase and geometries decrease, however, the RC time constraints of the interconnective wiring have become increasingly restrictive to integrated circuit performance. Thus in order to further improve performance, researchers have, in recent years, intensified their search for a metallurgy offering greater conductivity and insulative materials with lower dielectric constants. Copper is a prominent replacement for aluminum while various organic insulators such as parylene, and arylene ether polymers, have been successfully used as low dielectric constant(low-k) replacements for silicon oxide. Porous silica based materials such as siloxanes, aerogels and xerogels have also been implemented as ILD(inter layer dielectric) and IMD(inter-metal dielectric) layers. Fluorinated polyimides offer some improvement in dielectric constant lowering over conventional polyimides.

Many of the low-k dielectric materials, in particular the arylene ether based polymers, for example FLARE™ (FLuorinated ARylene Ether provided by Allied Signal Inc., 101 Columbia Road, P.O. Box 4000, Morristown, N.J. 07962) and PAE II™ or Lo-K™ 2000 (Poly Arylene Ether provided by the Schumacher Chemical Company which is a unit of Air Products and Chemicals, Inc., 7201 Hamilton Boulevard, Allentown, Pa. 18195-1501), exhibit patterning problems because of their low etch rate selectivities with respect to photoresist.

FLARE, PAE II, and other arylene ether polymer dielectric layer materials require an oxygen based etchant chemistry for effective patterning to form contact or via openings. Etching is done by RIE(reactive ion etching) or by plasma etching. Typically an $O_2/Ar$ or $O_2/He$ etchant chemistry is used. White, L. K., U.S. Pat. No. 4,470,871 utilizes a pure oxygen plasma to etch polyimide layers which have received a prior surface hardening treatment in a fluorine containing plasma.

In order to (contend with the poor etch rate selectivity of these organic low-k materials, a hardmask is used to etch the polymer layer. A layer of silicon oxide, deposited, by PECVD(plasma enhanced chemical vapor deposition) is applied over the cured polymer layer. A silicon dioxide hardmask is formed by patterning the silicon oxide layer. The $SiO_2$ hardmask can then be used to pattern the polymer dielectric layer. Havermann, R. H., U.S. Pat. No. 5,482,894 uses an oxygen plasma in a an HDP(high density plasma) etching tool to etch contact openings in an organic dielectric layer using an oxygen plasma and a photoresist patterned inorganic cap layer over the organic layer.

Although the $O_2/Ar$ or $O_2/He$ etchant chemistry is an effective etchant for the polymer layer, problems with respect to the profile of the openings etched in the polymer layer and the etching behavior of the hardmask are encountered. Under some etchant conditions severe bowing of the via profile is produced. Such a profile is shown in FIG. 1a. The polymer layer 12 is deposited over a patterned metal layer which is coated with a TiN ARC(anti reflective coating) 10. The via opening 16 patterned by the hardmask 14, has bowed sidewalls 18. Under the etching conditions which lead to the bowed profile, the hardmask profile remains essentially vertical. By varying the etching conditions to reduce the bowing of openings in the polymer, the hardmask begins to exhibit an angular aspect similar to faceting. This is shown in the cross section of FIG. 1b where a contact/via opening 16 in the polymer layer 12 is essentially vertical but the hardmask 14 has developed a severe angular aspect or facet 19 which has been caused by ion bombardment.

Faceting of the hardmask causes problems in maintaining pattern integrity as well as inadequate metal removal problems during a subsequent tungsten CMP(chemical mechanical polishing) process step. The bowing phenomenon and the hardmask faceting phenomenon work against each other. Thus as the polymer profile bowing is reduced the hardmask faceting increases. It is clear that the simple $O_2/Ar$ chemistry is inadequate for forming precision vias in polymer dielectric interlayers, in particular in sub-quarter micron technologies.

Jeng, S., U.S. Pat. No. 5,486,493 and U.S. Pat. No. 5,591,677 show methods of using low-k organic dielectric materials to form multilevel interconnects. Silicon oxide layers are used as hardmasks for patterning the organic layers and are cited, not only to overcome the etchant selectivity problems, but also to reduce subsequent hillock/void formation of metal lines, improve heat dissipation, and to serve as a barrier against mechanical instability of the organic polymer. However, etchant chemistries for the organic polymers are not given.

SUMMARY OF THE INVENTION

It is an object of this invention to provide an improved method for etching contact/via opening in organic dielectric layers.

It is another object of this invention to provide a method for etching contact/via openings in organic dielectric layers with essentially vertical sidewalls.

It is yet another object of this invention to describe an improved method for etching contact/via openings in an organic dielectric layer using a hardmask.

These objects are accomplished by forming a silicon oxide hardmask on the organic dielectric layer and anisotropically etching contact/via openings in the layer with an etchant containing $O_2$ and $Cl_2$. The presence of $Cl_2$ in the etchant gas permits the achievement of essentially vertical sidewalls on the openings etched in the organic dielectric layer without the occurrence of an angular aspect or facet along the edge of the hardmask. The addition of passivants, for example $N_2$, to the $O_2/Cl_2$ etchant gas mixture provides a further improvement of the vertical sidewall profile of the contact/via opening.

DESCRIPTION OF THE PREFERRED EMBODIMENTS

Figure 1A:
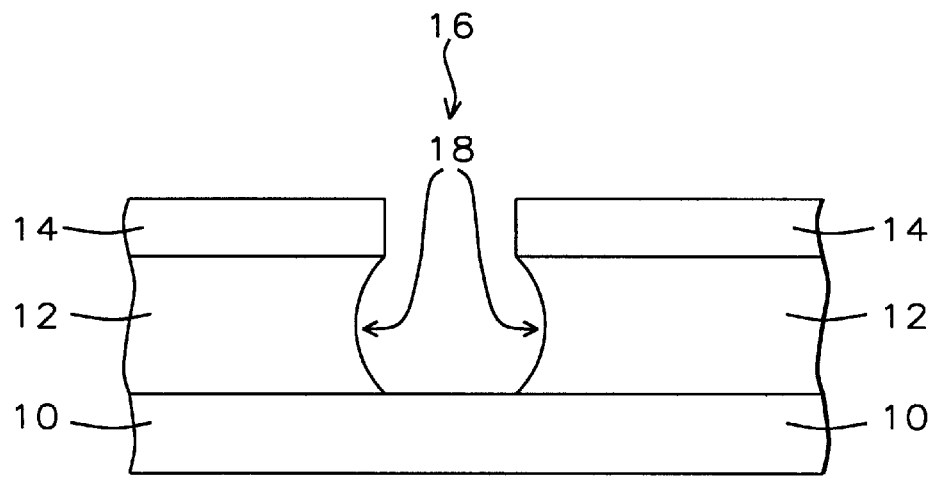
FIGS. 1a and 1b are cross sections of contact/via openings in an organic polymer layer made according to a prior art process.
Figure 1B:
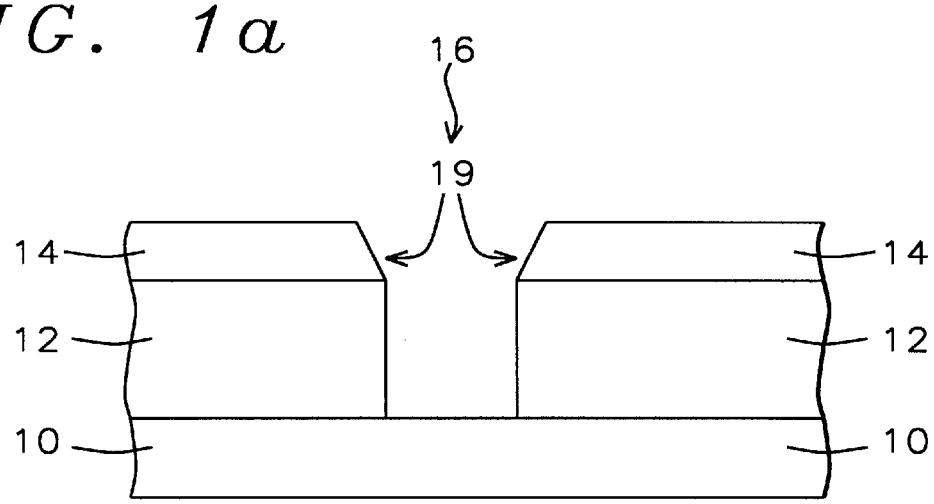
Figure 2A:
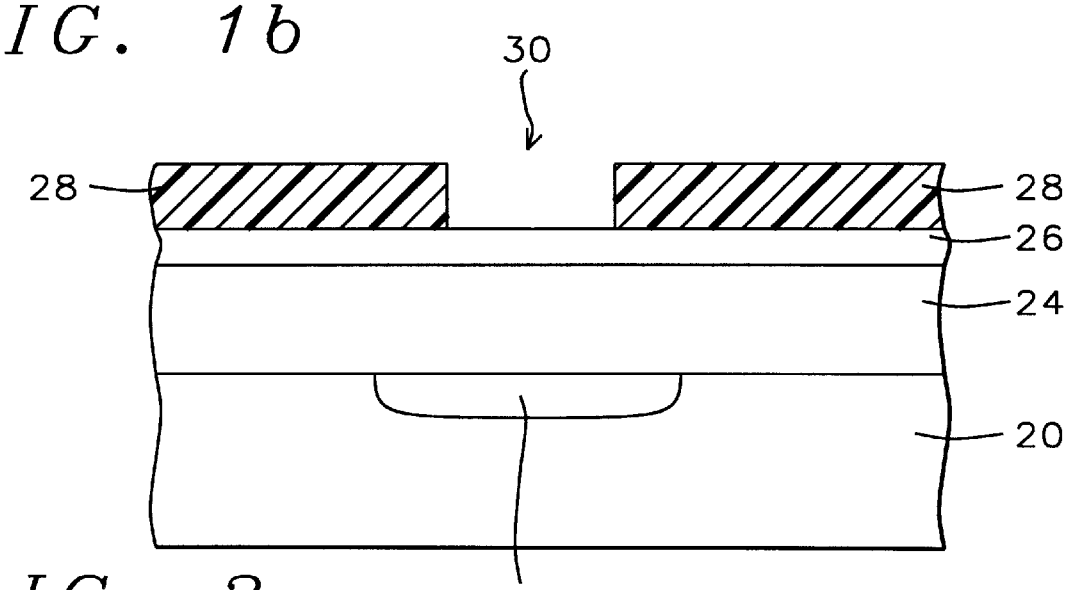
FIG. 2a through FIG. 2e are cross sections showing the sequence of process steps used to form a first embodiment of this invention.

In a first embodiment of the current invention, contact openings to semiconductive devices on a silicon wafer are formed in an organic dielectric layer which comprises an ILD layer. Referring to FIG. 2a, a monocrystalline silicon wafer 20 is provided and semiconductive devices are formed within the wafer surface by methods well known in the art. FIG. 2a is a cross section of a portion of the wafer 20 showing an element 22 of a semiconductive device to which a contact is to be formed. The element 22 is, for example a source/drain diffusion of a MOSFET(metal oxide semiconductor field effect transistor). A silicide layer, for example $WSi_x$ or $TiSi_x$, may be formed on the surface to the element 22 to afford a low resistivity contact. In addition to the diffusion element 22, a contact opening may also be formed to a polysilicon gate electrode(not shown) located elsewhere on the wafer and covered by the ILD layer 24.

A low-k organic ILD layer 24 is next formed over the wafer 20. Commercially available polymer forming liquids such as FLARE or PAE II are suitable precursors for forming the organic ILD layer 24. The ILD layer 24 is formed by first depositing liquid arylene ether monomer onto the wafer from a nozzle as the wafer 20 is spun on a wafer spinner. This method of film deposition is well known and widely practice for a great variety of applications such as the application of photoresists for photolithography and the application of spin-on-glasses for surface planarization. The thickness of the layer 24 is determined by the viscosity of the liquid monomer and the spinning speed of the wafer. After the deposition of the liquid, the film is dried and cured by thermal processing. The curing procedures are generally precursor specific and are well known to those in the art. In the current embodiment the thickness of the fully cured organic polymer layer 24 is preferably between about 0.7 and 0.9 microns thick. A broader thickness range between about 0.5 and 1.2 microns may also be successfully addressed by this invention.

A layer of silicon oxide 26 is next deposited on the cured organic layer 24 by PECVD. Other deposition means may alternately be used to deposit this layer, however, PECVD is preferred because of the low deposition temperature. PECVD silicon oxide may be deposited at temperatures between 200 and 350° C. from $SiH_4/O_2$ or $SiH_4/N_2O$ precursors. The silicon oxide layer is deposited to a thickness of 3,000 Å or thereabout.

The use of spin on organic polymer layers also has the effect of improving the planarization of the wafer surface, at least at a local level. If further global planarization is required, the wafer may be subjected to a CMP step, either after the organic ILD layer has been cured or after the PECVD silicon oxide layer is deposited. CMP is a procedure that has, in recent years, been perfected to a fine art and is capable of planarizing wafer surfaces to a high precision.

The silicon oxide layer 26 is next patterned by a photoresist layer 28 in which a contact opening 30 is defined using conventional photolithographic procedures. The photoresist pattern 28 is used to form a silicon oxide hardmask in the layer 26 which is then used to etch a contact opening in the subjacent organic layer 24. The utilization of a silicon oxide hardmask also permits the use of very thin photoresist layers (<0.8 microns thick) to pattern the hardmask, a requirement for the resolution of images of the order of 0.25 microns by DUV(deep ultraviolet) photolithography.

The wafer 20 is loaded into the chamber of a dry etching tool capable of anisotropic plasma etching, for example, a high density plasma(HDP) parallel plate reactor. Suitable reactors include the model TCP-9100 manufactured by LAM Research Corporation and a Decoupled Plasma Source (DPS) metal etch reactor available from Applied Materials, Inc., 3050 Bowers Ave., Santa Clara, Calif. 95054. These etching tools provide the capability of controlling both the ion density(TCP) and the ion energy(BIAS) of the glow discharge. Adjustment and management of these parameters is well known by those in the art.

The silicon oxide hardmask 26 and the polymer layer 24 may be etched successively within the same tool. Alternatively, separate etching tools may be used for etching the hardmask 26 and the polymer layer 24. The residual photoresist mask used to pattern the hardmask is generally entirely consumed during the etching.

Figure 2B:
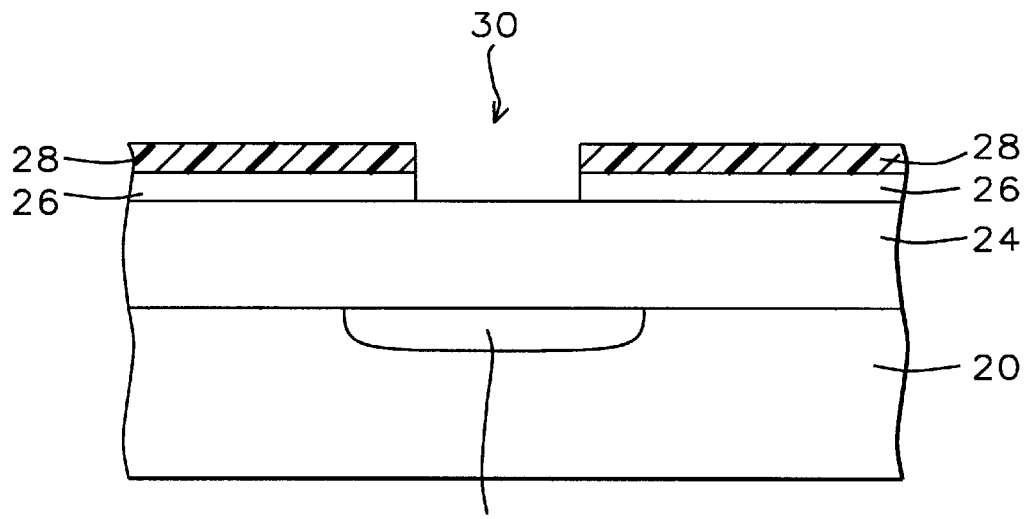

Referring to FIG. 2b, the silicon oxide layer 26 is first patterned by RIE or anisotropic plasma etching to form a hardmask by using an etchant containing fluorocarbons, for example $CF_4$ or $CHF_3$. Anisotropic etching of silicon oxide is a well known procedure in the art. Since the photoresist is only required to endure the etching of the hardmask the resist layer may be of minimal thickness and therefore optimal for high resolution photolithography. The completion of the hardmask patterning is detected by using optical emission spectroscopy and sensing endpoint by observation of the decay of the silicon peak at 405 nm. After endpoint is reached the oxide etch is continued for a timed over-etch period of about 20%. This assures complete opening of the hardmask pattern.

The etchant gas is next changed to a mixture containing $O_2$ at a flow rate of between about 10 and 60 SCCM (standard cubic centimeters per minute), $Cl_2$ at a flow rate of between about 10 and 60 SCCM, $N_2$ at a flow rate of between about 10 and 30 SCCM, and a carrier gas of argon at a flow rate of between about 10 and 60 SCCM. The flow rate of the carrier gas is adjusted to maintain a pressure of between about 6 and 12 mTorr in the reactor chamber.

Figure 2C:
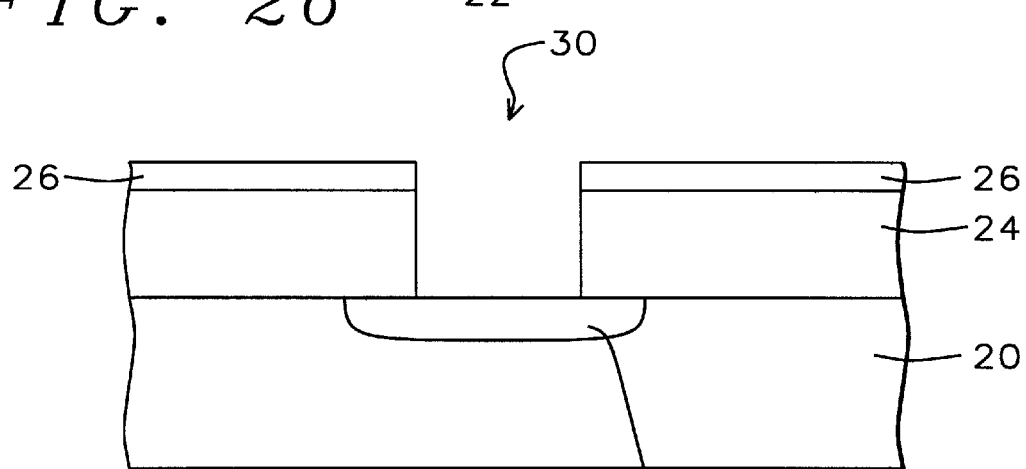

An rf discharge having a power of between about 500 and 1,200 Watts TCP and between about 400 and 800 Watts BIAS is struck in the etch chamber and the organic polymer layer 24 is etched until an endpoint is reached. The endpoint is determined by optical emission spectroscopy by observing a carbon peak, for example CO. Alternately, in a well calibrated system, endpoint may be taken after a predetermined time has elapsed. An over etch period of about 20% is allowed to assure complete removal of polymer layer 24 at the base of the contact opening. FIG. 2c shows a cross section of the contact opening 30 after the organic layer etch. Any photoresist which remained after the silicon oxide hardmask patterning will also have been removed by the oxygen etch, leaving only residual hardmask 26 exposed.

It is found that the addition of $Cl_2$ to the etchant mixture has a profound effect in preventing the hardmask from faceting. The nitrogen is an optional additive and acts as a passivating agent, causing protective polymer formation and thereby reducing the bowing of the sidewalls of the opening 30. Other gases which may be added to the oxygen/chlorine gas mixture as a passivation agent include $BCl_3$ and $CHF_3$.

After the contact opening 30 has been formed in the organic layer 24, the residual oxide hardmask layer 26 is preferably left in place. Alternately, the residual $SiO_2$ hardmask 26 may be removed after contact opening by a dip etch in dilute aqueous HF.

Figure 2D:
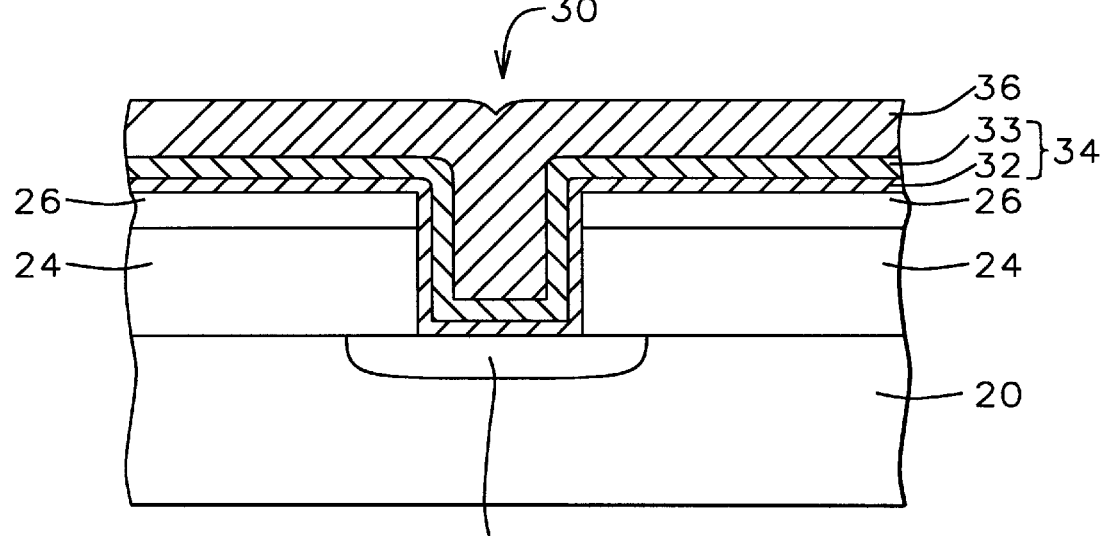

Referring now to FIG. 2d, a Ti/TiN adhesion/barrier layer 34 is deposited on the wafer and into the contact opening 30. The formation of Ti/TiN adhesion/barrier layers for contacts is a well known and widely practiced procedure. Typically the Ti layer 32 and the TiN layer 33 are sequentially deposited by a PVD(physical vapor deposition) method, for example by sputtering. The Ti adhesion layer 32 is deposited to about 300 Å in thickness and the TiN barrier layer 33 to about 100 Å. A tungsten layer 36 is next deposited on the wafer using LPCVD, preferably by the silane reduction method using $SiH_4$ and $WF_6$. This deposition method is well known to those in the art and permits the deposition of W at temperatures between about 240° C. and 280° C.

Figure 2E:
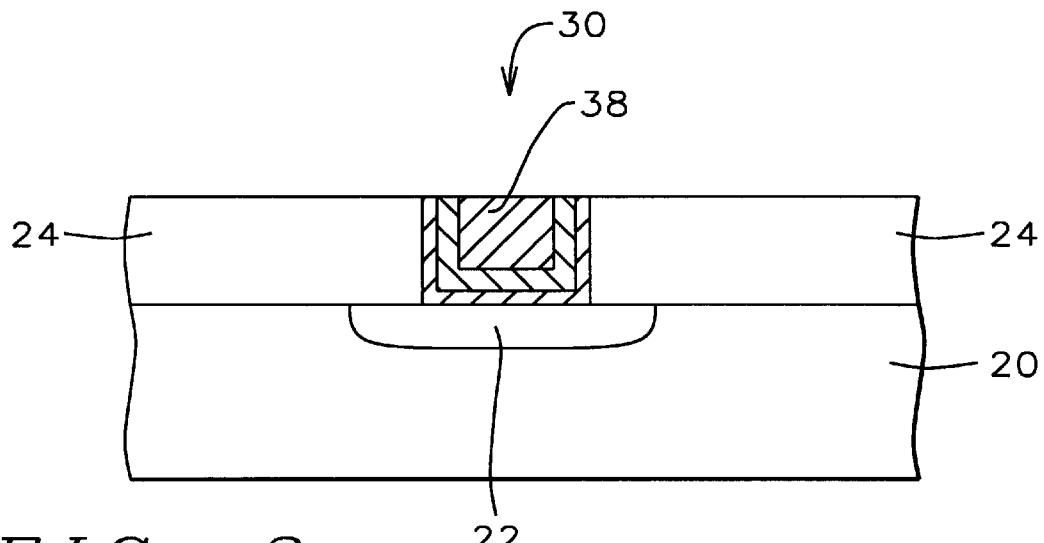

The tungsten layer 36 fills in the contact opening 30 and blankets the entire wafer. The tungsten layer 36 is then polished back to the ILD layer 24 surface by CMP thereby forming an isolated contact in the opening 30. If the residual hardmask oxide 26 was not removed after the contact opening etch, it may now be polished away by the CMP. An alternate method, for example RIE etchback, may also be used to remove the tungsten layer 36 to the surface of the ILD layer 24. The completed contact 38 is shown by the cross section in FIG. 2e.

Figure 3A:
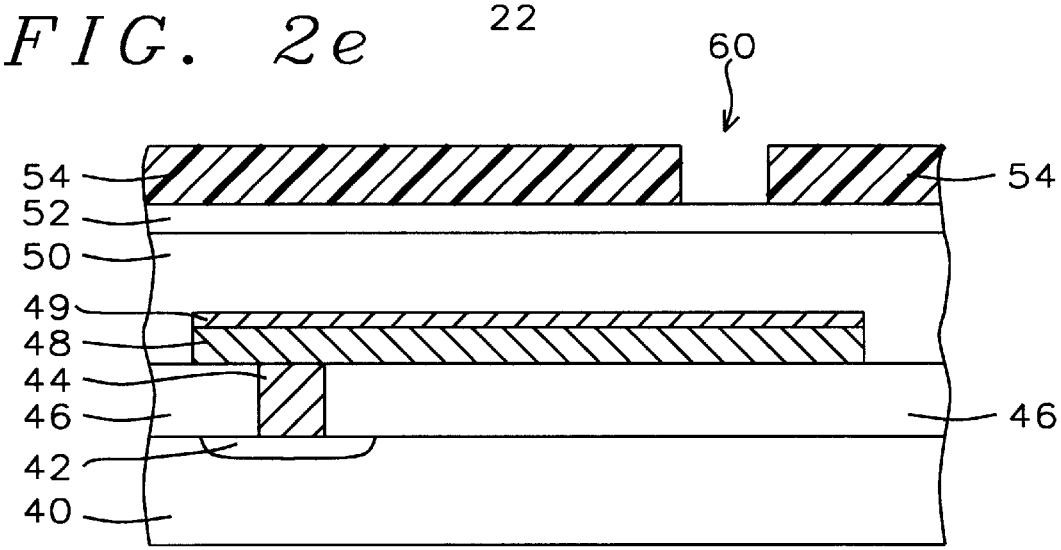
FIG. 3a through FIG. 3e are cross sections showing the sequence of process steps used to form a second embodiment of this invention.

In a second embodiment of this invention, a via between two conductive wiring levels is formed. An IMD layer which separates the two conductive wiring levels is formed of a low-k organic dielectric material. Referring to FIG. 3a, a monocrystalline silicon wafer 40 is provided. A semiconductive device is formed within the wafer surface by methods well known in the art and a contact 44 is shown which connects an element 42 of the semiconductive device to a metal stripe 48 on a first wiring level. Procedures for forming contacts and patterning wiring levels are well know in the art and such a contact may be formed by the process described by in the first embodiment of this invention. The wiring level of which the metal stripe 48 is a portion, is formed by patterning a metal layer over the insulative IMD layer 46. The wiring level of the current embodiment is done by depositing metal layer, for example an aluminum alloy, patterning the layer by photolithography. A TiN ARC layer 49 overlies the metal layer 48.

A low-k organic IMD layer 50 is next formed over the wafer 40. Commercially available polymer forming liquids such as FLARE or PAE II are suitable precursors for forming the organic IMD layer 50. The IMD layer 50 is formed by first depositing liquid arylene ether monomer onto the wafer from a nozzle as the wafer 40 is spun on a wafer spinner. This method of film deposition is well known and widely practice for a great variety of applications such as the application of photoresists for photolithography and the application of spin-on-glasses for surface planarization. The thickness of the layer 50 is determined by the viscosity of the liquid monomer and the spinning speed of the wafer. After the deposition of the liquid, the film is dried and cured by thermal processing. The curing procedures are generally precursor specific and are well known to those in the art. In the current embodiment the thickness of the fully cured organic polymer layer 50 is preferably between about 0.5 and 0.9 microns thick. A broader thickness range between about 0.5 and 1.2 microns may also be successfully addressed by this invention.

A layer of silicon oxide 52 is next deposited on the cured organic layer 50 by PECVD. Other deposition means may alternately be used to deposit this layer. However, is preferred because of the low deposition temperature. PECVD silicon ox de may be deposited at temperatures between 200 and 350° C. from $SiH_4/O_2$ or $SiH_4/N_2O$ precursors. The silicon oxide layer is deposited to a thickness of 3,000 Å or thereabout.

The use of spin on organic polymer layers also has the effect of improving the planarization of the wafer surface, at least at a local level. If further global planarization is required, the wafer may be subjected to a CMP step, either after the organic IMD layer has been cured or after the PECVD silicon oxide layer is deposited. CMP is a procedure that has, in recent years, been perfected to a fine art and is capable of planarizing wafer surfaces to a high precision.

The silicon oxide layer 52 is next patterned by a photoresist layer 54 in which a via opening 60 is defined using conventional photolithographic procedures. The photoresist pattern 54 will be used to form a silicon oxide hardmask which is then used to etch a via in the subjacent organic layer 50. The utilization of a silicon oxide hardmask also permits the use of very thin photoresist layers (<0.8 microns thick) to pattern the hardmask, a requirement for the resolution of images of the order of 0.25 microns by DUV(deep ultraviolet) photolithography.

The wafer 40 is loaded into the chamber of a dry etching tool capable of anisotropic plasma etching, for example, a high density plasma(HDP) parallel plate reactor. Suitable reactors include the LAM model TCP-9100 and the Applied Materials DPS metal etch reactor as cited in the first embodiment. The etching tool provides the capability of controlling both the ion density(TCP) and the ion energy(BIAS) of the glow discharge.

Figure 3B:
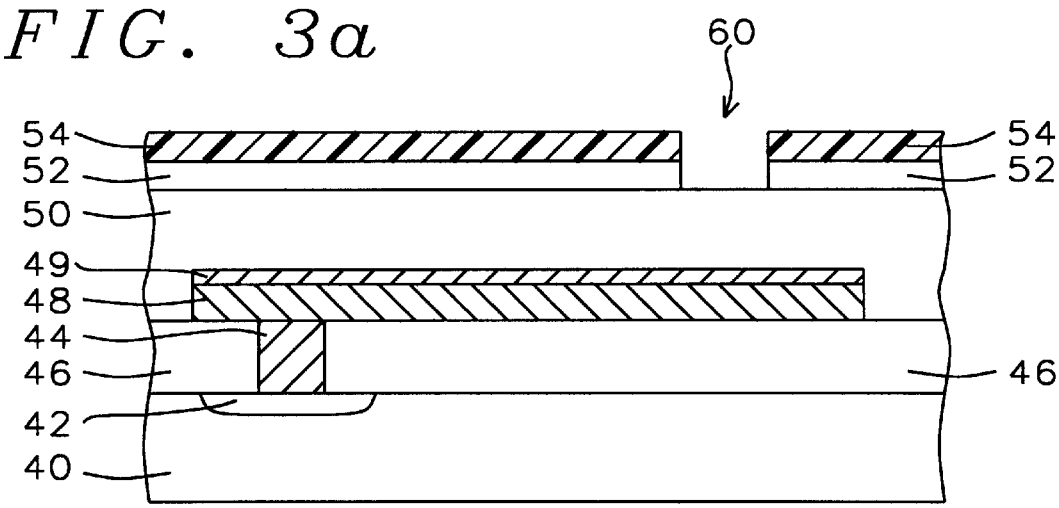

Referring to FIG. 3b, the silicon oxide layer 52 is first patterned by RIE or anisotropic plasma etching to form a hardmask by using an etchant containing fluorocarbons, for example $CF_4$ or $CHF_3$. Anisotropic etching of silicon oxide is a well known procedure in the art. Since the photoresist is only required to endure the etching of the hardmask the resist layer may be of minimal thickness and therefore optimal for high resolution photolithography. The completion of the hardmask patterning is detected by using optical emission spectroscopy and sensing endpoint by observing the decay of the silicon peak at 405 nm. After an endpoint is reached, the oxide etch is continued for a timed over-etch period of about 20%. This assures complete opening of the hardmask pattern.

The etchant gas is next changed to a mixture containing $O_2$ at a flow rate of between about 10 and 60, $Cl_2$ at a flow rate of between about 10 and 60 SCCM, $N_2$ at a flow rate of between about 10 and 30 SCCM, and a carrier gas of argon at a flow rate of between about 10 and 60 SCCM. The flow rate of the carrier gas is adjusted to maintain a pressure of between about 6 and 12 mTorr in the reactor chamber.

Figure 3C:
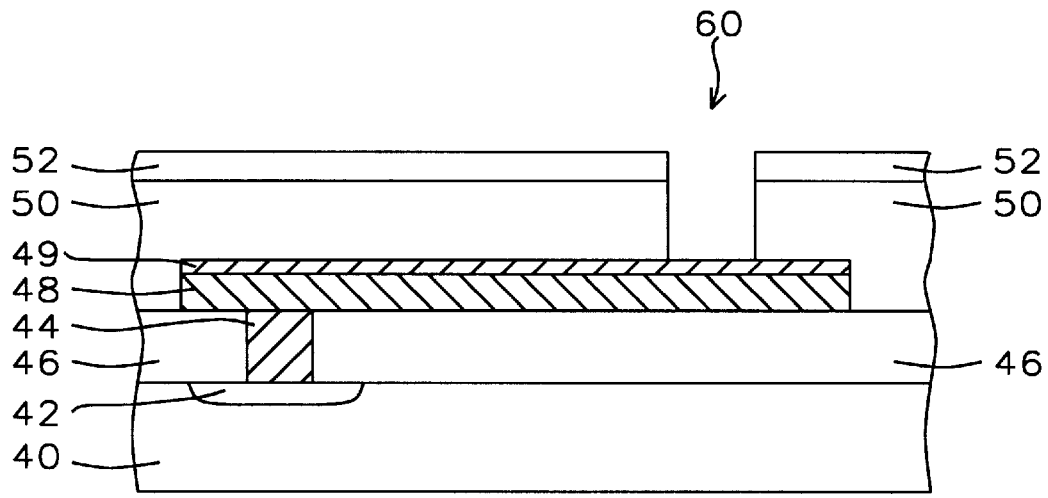

An rf discharge having a power of between about 500 and 1,200 Watts TCP and between about 400 and 800 Watts BIAS is struck in the etch chamber and the organic layer 50 is etched until an endpoint is reached. The endpoint is determined by optical emission spectroscopy by observing a carbon peak, for example, CO. An over etch period of about 20% is allowed to assure complete removal of the organic layer at the base of the via opening 60 and exposing the TiN ARC 49 on the metal stripe 48. FIG. 3c shows a cross section of the via opening 60 after the organic IMD layer 50 etch. Any photoresist which remained after the silicon oxide hardmask patterning will also have been removed by the oxygen etch, leaving only residual hardmask 52 exposed.

It is found that the addition of $Cl_2$ to the etchant mixture has a profound effect in preventing the hardmask from faceting. The nitrogen is an optional additive and acts as a passivating agent, having the effect of further reducing the bowing of the walls of the via opening 60. Other passivation agents which may be added to the oxygen/chlorine gas mixture include $BCl_3$ and $CHF_3$. After the via opening 60 has been formed, the residual oxide hardmask 52 is preferably left in place. Alternately, the residual $SiO_2$ hardmask 52 may be removed after via opening by a dip etch in dilute aqueous HF.

Figure 3D:
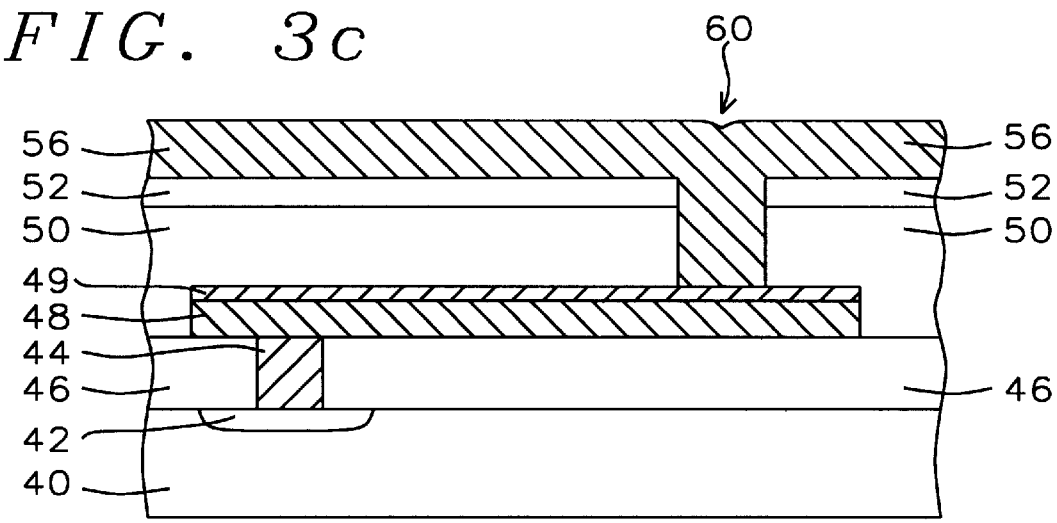
Figure 3E:
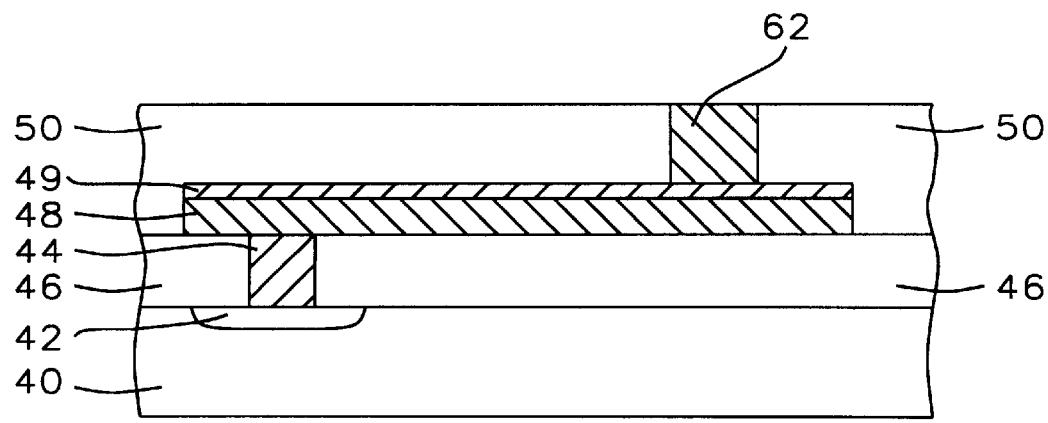

Referring now to FIG. 3d, a tungsten layer 56 is deposited on the wafer using LPCVD, preferably by the silane reduction method using $SiH_4$ and $WF_6$. This deposition method is well known to those in the art and permits the deposition of W at temperatures between about 240° C. and 280° C. The tungsten layer 56 fills in the via opening 60 and blankets the entire wafer. The tungsten layer 56 is then polished back to the IMD layer 50 surface by CMP thereby forming an isolated via in the opening 60. If the residual hardmask oxide 52 was not removed after the via opening etch, it may now be polished away by CMP. An alternate method, for example RIE etchback, may also be used to remove the tungsten layer 56 to the surface of the IMD layer 50. The completed via 62 is shown in the cross section in FIG. 2e.

The embodiments use silicon wafers. It should be well understood by those skilled in the art that other semiconductor substrates may also be used and, by applying the procedures taught by this invention, the same objectives may be achieved. While the invention has been particularly shown and described with reference to the preferred embodiments thereof, it will be understood by those skilled in the art that various changes in form and details may be made without departing from the spirit and scope of the invention.

Although the embodiments are applied to poly(arylene ether) dielectric layers other low-k organic polymer materials are also contemplated by this invention. In addition other deposition methods for such low-k organic materials such as vapor deposition may be used without departing from the spirit and scope of the invention.

What is claimed is:

1. A method for patterning an opening in an organic polymer layer on a substrate comprising:
    (a) providing a substrate having an organic polymer layer;
    (b) forming a hardmask over said organic polymer layer; and
    (c) anisotropically etching said organic polymer layer in a high density plasma etcher with an etchant gas containing oxygen and chlorine, under conditions which preserve the pattern integrity of the hardmask and form an essentially un-bowed, vertical profiled opening.

2. The method of claim 1 wherein said organic polymer layer is selected from the group consisting of a poly(arylene ether) and a polyimide.

3. The method of claim 1 wherein said hardmask comprises silicon oxide.

4. The method of claim 1 wherein said conditions comprise flowing said oxygen at a flow rate of between about 10 and 60 SCCM, and said chlorine at a flow rate of between about 10 and 60 SCCM and an inert carrier gas at a flow rate adjusted to maintain a chamber pressure of between about 6 and 10 mTorr in a plasma, struck in said high density plasma etcher, having an rf power of between about 500 and 1,200 Watts TCP and between about 400 and 800 Watts BIAS.

5. The method of claim 1 further comprising adding a passivating agent to said etchant gas.

6. The method of claim 5 wherein said passivating agent is selected from the group consisting of $N_2$, $BCl_3$, and $CHF_3$.

7. A method for forming a contact on a semiconductor wafer comprising:
    (a) providing a semiconductor wafer;
    (b) forming a organic polymer layer on said semiconductor wafer;
    (c) patterning a hardmask on said organic polymer layer;
    (d) anisotropically etching said organic polymer layer in a high density plasma) etcher with an etchant gas containing oxygen and chlorine, under conditions which preserve the pattern integrity of the hardmask and form an essentially un-bowed, vertical profiled opening; and
    (e) forming a conductive contact in said opening.

8. The method of claim 7 wherein said organic polymer layer is selected from the group consisting of a poly(arylene ether) and a polyimide.

9. The method of claim 7 wherein said hardmask comprises silicon oxide.

10. The method of claim 7 wherein said conditions comprise flowing said oxygen at a flow rate of between about 10 and 60 SCCM, and said chlorine at a flow rate of between about 10 and 60 SCCM and an inert carrier gas at a flow rate adjusted to maintain a chamber pressure of between about 6 and 10 mTorr in a plasma, struck in said high density plasma etcher, having an rf power of between about 500 and 1,200 Watts TCP and between about 400 and 800 Watts BIAS.

11. The method of claim 7 further comprising adding a passivating agent to said etchant gas.

12. The method of claim 11 wherein said passivating agent is selected from the group consisting of $N_2$, $BCl_3$, and $CHF_3$.

13. A method for forming a via on a semiconductor wafer comprising:
    (a) providing a semiconductor wafer having a first conductive layer;
    (b) forming a organic polymer layer on said first conductive layer;
    (c) forming a hardmask over said organic polymer layer;
    (d) anisotropically etching said organic polymer layer in a high density plasma etcher with an etchant gas containing oxygen and chlorine, under conditions which preserve the pattern integrity of the hardmask and form an essentially un-bowed, vertical profiled opening in said organic polymer layer exposing a region of said first conductive layer; and
    (e) forming a conductive via in said opening.

14. The method of claim 13 wherein said organic polymer layer is selected from the group consisting of a poly(arylene ether) and a polyimide.

15. The method of claim 13 wherein said hardmask comprises silicon oxide.

16. The method of claim 13 wherein said conditions comprise flowing said oxygen at a flow rate of between about 10 and 60 SCCM, and said chlorine at a flow rate of between about 10 and 60 SCCM and an inert carrier gas at a flow rate adjusted to maintain a chamber pressure of between about 6 and 10 mTorr in a plasma, struck in said high density plasma etcher, having an if power of between about 500 and 1,200 Watts TCP and between about 400 and 800 Watts BIAS.

17. The method of claim 13 further comprising adding a passivating agent to said etchant gas.

18. The method of claim 17 wherein said passivating agent is selected from the group consisting of $N_2$, $BCl_3$, and $CHF_3$.

* * * * *